US011334013B2

(12) United States Patent
Sato

(10) Patent No.: US 11,334,013 B2
(45) Date of Patent: May 17, 2022

(54) IMAGE FORMING APPARATUS

(71) Applicant: CANON KABUSHIKI KAISHA, Tokyo (JP)

(72) Inventor: Kazumi Sato, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/240,835

(22) Filed: Apr. 26, 2021

(65) Prior Publication Data

US 2021/0341865 A1 Nov. 4, 2021

(30) Foreign Application Priority Data

Apr. 30, 2020 (JP) ............................ JP2020-080387

(51) Int. Cl.

*G03G 15/00* (2006.01)
*H05K 7/14* (2006.01)
*G03G 21/16* (2006.01)
*H04N 1/00* (2006.01)

(52) U.S. Cl.

CPC ..... *G03G 15/5041* (2013.01); *G03G 15/5054* (2013.01); *G03G 15/80* (2013.01); *G03G 21/1647* (2013.01); *H05K 7/14* (2013.01); *G03G 21/1652* (2013.01); *H04N 1/00559* (2013.01); *H04N 2201/02466* (2013.01); *H04N 2201/02468* (2013.01)

(58) Field of Classification Search

CPC ........... G03G 15/5041; G03G 15/5054; G03G 15/80; G03G 21/1647; G03G 21/1652; H05K 7/14; H04N 2201/02468; H04N 1/00559; H04N 2201/02466

See application file for complete search history.

(56) References Cited

U.S. PATENT DOCUMENTS 5,111,041 A * 5/1992 Imai .................... H01L 31/0203 250/216
6,642,511 B1 * 11/2003 Lee ...................... H04N 5/2253 250/235
2005/0128533 A1 * 6/2005 Maruta .................... H04N 1/03 358/483

FOREIGN PATENT DOCUMENTS

CN 109964164 A * 7/2019 ....... G03G 15/04072
JP 2006-208266 A 8/2006
JP 2017090597 A * 5/2017 ......... G03G 15/5054
JP 6785454 B2 * 11/2020 ........... H01L 25/167
JP 2021047118 A * 3/2021

* cited by examiner

*Primary Examiner* — Ryan D Walsh

(74) *Attorney, Agent, or Firm* — Canon U.S.A., Inc. I.P. Division

(57) ABSTRACT

An image forming apparatus includes a fixing portion and an optical sensor having first and second positioning holes and a connector. The fixing portion includes first and second screw holes, a through-hole, and an extension portion. If the optical sensor is placed on the fixing portion in a first orientation where the first positioning hole is aligned with the first screw hole and the second positioning hole is aligned with the second screw hole, the connector is inserted into the through-hole without interfering with the extension portion so that screws fix the optical sensor. If the optical sensor is placed on the fixing portion in a second orientation where the first positioning hole is aligned with the second screw hole and the second positioning hole is aligned with the first screw hole, the connector interferes with the extension portion so that the connector is not inserted into the through-hole.

7 Claims, 12 Drawing Sheets

100
101Y
101M
101C
101K
209
7
15Y 1Y 8Y 9Y
15M 1M 8M 9M
15C 1C 8C 9C
15K 1K 8K 9K
R2
16Y
16M
16C
16K
10Y
10M
10C
10K
R1
5
6
14
3
4
12
13
26
27
24
23
22
19
20
S
CD 100
120
IMAGE FORMING CONTROLLER
111
ROM
112
LIGHT SCANNING DEVICE CONTROLLER
113
DEVELOPING DEVICE CONTROLLER
114
PHOTOSENSITIVE DRUM CONTROLLER
115
INTERMEDIATE TRANSFER BELT CONTROLLER
15
LIGHT SCANNING DEVICE
16
DEVELOPING DEVICE
1
PHOTOSENSITIVE DRUM
5
INTERMEDIATE TRANSFER BELT
109
CPU
110
A/D CONVERTER
300
P1
P2
L1
L2
7
PATTERN SENSOR
207
CONTROL IC

IMAGE FORMING APPARATUS

BACKGROUND

Field

The present disclosure relates to an image forming apparatus including a fixing portion configured to fix an optical sensor.

Description of the Related Art

Hitherto, a color image forming apparatus such as a copying machine, a printer, or a facsimile machine, which employs tandem electrophotography, corrects position misregistration and density deviation for each color. For the correction, a color misregistration detection pattern and a density detection pattern are formed by an image forming portion for each color, and a color misregistration amount and a density deviation amount are detected to correct color misregistration and the density deviation. The color misregistration detection pattern and the density detection pattern are detected by a light detector (optical sensor) arranged in the vicinity of an intermediate transfer belt. The light detector includes a light emitting element and a light receiving element. The light emitting element is configured to illuminate the intermediate transfer belt, and the color misregistration detection pattern and the density detection pattern, which are formed on the intermediate transfer belt. The light receiving element is configured to receive reflected light from the intermediate transfer belt, and the color misregistration detection pattern and the density detection pattern. The color misregistration amount and the density deviation amount are detected based on a difference between a reflected light amount from the intermediate transfer belt and a reflected light amount from the color misregistration detection pattern and a difference between the reflected light amount from the intermediate transfer belt and a reflected light amount from the density detection pattern, respectively.

Along with downsizing of the image forming apparatus, downsizing of an optical portion of the light detector is demanded. In Japanese Patent Application Laid-Open No. 2006-208266, there is disclosed a light detector that is downsized by directly mounting the light emitting element and the light receiving element on a circuit board so that a distance between the light emitting element and the light receiving element is reduced as compared to that in a configuration in which components (lead components) to be mounted through a lead frame are used. A control circuit component, a connector for connection to an external controller, and other components are mounted on a surface of the circuit board, which is opposite to the surface on which the light emitting element and the light receiving element are directly mounted, to thereby downsize the circuit board so that the optical detector can be further downsized.

In the optical detector, the circuit board of the light detector is fixed to a fixing portion with use of two screws in such a manner that the light detector can focus on a surface of the intermediate transfer belt. The circuit board is rectangular, and has screw holes formed in both end portions of the circuit board in a longitudinal direction. Thus, when the circuit board is to be fixed to the fixing portion, misassembling of the circuit board to be mounted in an incorrect orientation may occur. When the circuit board is fixed in an incorrect orientation, the light detector cannot detect a pattern image at a correct position. Thus, malfunction and erroneous detection of the image forming apparatus may occur.

SUMMARY

According to an aspect of the present disclosure, an image forming apparatus includes an image bearing member, an optical sensor configured to detect a pattern image formed on the image bearing member, and a fixing portion configured to fix the optical sensor, wherein the optical sensor includes (i) a circuit board having a first positioning hole and a second positioning hole, (ii) a light emitting element and a light receiving element, which are provided on a first side of the circuit board, and (iii) a connector, wherein the connector is provided on a second side of the circuit board that is opposite to the first side, and the connector is arranged at a position offset from a center between the first positioning hole and the second positioning hole toward the second positioning hole, wherein the fixing portion includes (i) a first screw hole, (ii) a second screw hole, (iii) a through-hole provided between the first screw hole and the second screw hole, (iv) a support portion configured to support a portion of the circuit board in which the first positioning hole is provided, and (v) an extension portion extending from the support portion toward the through-hole, wherein, in a case in which the optical sensor is placed on the fixing portion in a first orientation in which the first positioning hole is aligned with the first screw hole and the second positioning hole is aligned with the second screw hole, the connector is inserted into the through-hole without interfering with the extension portion so that the optical sensor is fixed to the fixing portion by screws, and wherein, in a case in which the optical sensor is placed on the fixing portion in a second orientation in which the first positioning hole is aligned with the second screw hole and the second positioning hole is aligned with the first screw hole, the connector interferes with the extension portion so that the connector is not inserted into the through-hole.

Further features of the present disclosure will become apparent from the following description of exemplary embodiments with reference to the attached drawings.

DESCRIPTION OF THE EMBODIMENTS

Embodiments of the present disclosure are described below with reference to the accompanying drawings.

First Embodiment

Image Forming Apparatus

Figure 1:
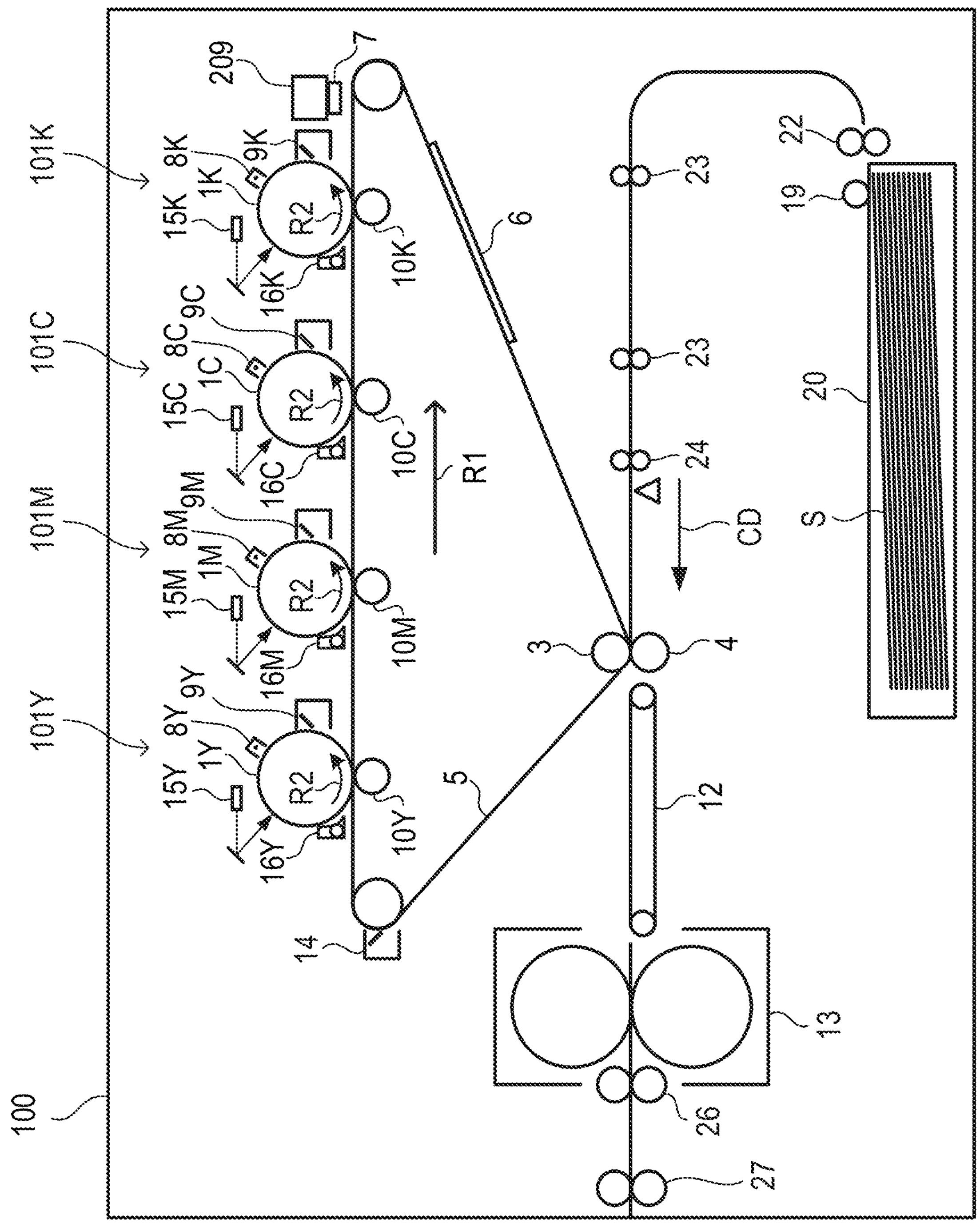
FIG. 1 is a sectional view of an image forming apparatus.

FIG. 1 is a sectional view of an image forming apparatus 100. The image forming apparatus 100 is a printer configured to form a color image on a recording medium S such as a paper sheet (sheet) with toners of a plurality of colors by using electrophotography. The image forming apparatus 100 includes four image forming portions 101 (101Y, 101M, 101C, and 101K). The image forming portion 101Y is configured to form a yellow image with a yellow toner. The image forming portion 101M is configured to form a magenta image with a magenta toner. The image forming portion 101C is configured to form a cyan image with a cyan toner. The image forming portion 101K is configured to form a black image with a black toner. The alphabet letters Y, M, C, and K in the reference symbols represent yellow, magenta, cyan, and black, respectively. In the following description, the alphabet letters Y, M, C, and K in the reference symbols may be omitted unless otherwise needed. The four image forming portions 101 have the same structure except for colors of developers (toners).

The image forming portion 101 includes a photosensitive drum 1 corresponding to a photosensitive member. A charging device 8, a light scanning device (laser writing portion) 15, a developing device 16, a primary transfer roller 10, and a drum cleaner 9 are arranged around the photosensitive drum 1. An intermediate transfer belt (image bearing member) 5 having an endless shape is arranged below the photosensitive drums 1. The intermediate transfer belt 5 is rotated to be moved in a moving direction R1. The primary transfer rollers 10 are arranged in such a manner as to be opposed to the photosensitive drums 1 across the intermediate transfer belt 5. Each of the primary transfer rollers 10 is configured to transfer a toner image formed on the photosensitive drum 1 onto the intermediate transfer belt 5. A secondary transfer roller 4 is arranged in such a manner as to be opposed to a belt support roller 3 across the intermediate transfer belt 5. The secondary transfer rollers 4 is configured to transfer a toner image formed on the intermediate transfer belt 5 onto the recording medium S.

A feed cassette 20 configured to receive the recording media S such as paper sheets (sheets) is arranged in a lower part of the image forming apparatus 100. The recording medium S is fed from the feed cassette 20 by a pickup roller 19, and is then conveyed to the secondary transfer roller 4 by feed rollers 22, conveyance rollers 23, and registration rollers 24. A conveyance belt 12 and a fixing device 13 are arranged downstream of the secondary transfer roller 4 in a conveyance direction CD of the recording medium S. The fixing device 13 is configured to fix a toner image onto the recording medium S.

An image forming process performed by the image forming apparatus 100 is now described. Image forming processes performed in the four image forming portions 101 are the same, and thus the image forming process performed in the image forming portion 101Y configured to form a yellow toner image is representatively described. Thus, a description of the image forming processes in the image forming portion 101M configured to form a magenta toner image, the image forming portion 101C configured to form a cyan toner image, and the image forming portion 101K configured to form a black toner image is herein omitted.

A photosensitive drum 1Y is rotated in a direction indicated by an arrow R2 in FIG. 1. A charging device 8Y uniformly charges a surface of the photosensitive drum 1Y to a predetermined potential. A light scanning device 15Y causes a semiconductor laser (not shown) serving as a light source to emit laser light (light beam) modulated in accordance with image information of yellow to thereby form an electrostatic latent image on the uniformly charged surface of the photosensitive drum 1Y. A developing device 16Y develops the electrostatic latent image with a yellow toner (developer) to form a yellow toner image. A primary transfer roller 10Y transfers the yellow toner image formed on the photosensitive drum 1Y onto the intermediate transfer belt 5. The toner remaining on the photosensitive drum 1Y after the primary transfer is collected by a drum cleaning device 9Y.

Similarly, a magenta toner image formed by the image forming portion 101M is transferred in such a manner as to be superimposed on the yellow toner image formed on the intermediate transfer belt 5 with high accuracy. Then, a cyan toner image and a black toner image are transferred in such a manner as to be superimposed in order on the magenta toner image formed on the intermediate transfer belt 5. As a result, the toner images of the four colors are superimposed in order on the intermediate transfer belt 5 to form a color toner image 6.

The recording medium S, which has been conveyed from the feed cassette 20, is conveyed to the secondary transfer roller 4 in such a manner that a leading end of the color toner image 6 on the intermediate transfer belt 5 and a leading end of the recording medium S are registered with each other by the registration rollers 24. The color toner image 6 on the intermediate transfer belt 5 is collectively transferred onto the recording medium S by the second transfer roller 4. The toners remaining on the intermediate transfer belt 5 after the secondary transfer are collected by an intermediate transfer belt cleaner 14. The recording medium S onto which the toner image has been transferred is conveyed to the fixing device 13 by the conveyance belt 12. The fixing device 13 heats and presses the recording medium S to fix the toner image onto the recording medium S. The recording medium S carrying the image formed thereon is delivered to an outside of the image forming apparatus 100 by fixing outlet rollers 26 and delivery rollers 27.

Color misregistration may sometimes occur in the color toner image 6 formed on the intermediate transfer belt 5 due to a variation in manufacture of the light scanning devices 15 and the photosensitive drums 1, deformation of components, which is caused by a temperature rise, and a variation in conveyance of the intermediate transfer belt 5. The color misregistration occurs due to a shift of positions at which the yellow toner image, the magenta toner image, the cyan toner image, and the black toner image are formed. The color misregistration is corrected based on a result of detection, which is obtained by detecting a color misregistration detection pattern formed on the intermediate transfer belt 5 with use of a pattern sensor (optical sensor) 7.

Further, an image density is varied depending on temperature and humidity conditions of an environment where the image forming apparatus 100 is used and a frequency of use of each of the colors. The variation in image density may cause a density deviation, which is a deviation of the image density from a predetermined density. The density deviation is corrected by controlling the light scanning devices 15, the developing devices 16, and the photosensitive drums 1 based on a result of detection, which is obtained by detecting a density detection pattern formed on the intermediate transfer belt 5 with use of the pattern sensor 7.

Pattern Sensor

Figure 11A:
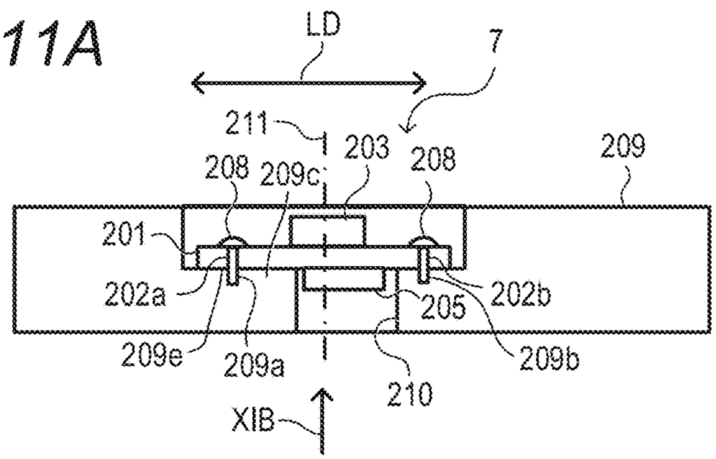
FIG. 11A, FIG. 11B, FIG. 11C, and FIG. 11D are explanatory views of mounting of the pattern sensor to a fixing portion of a first embodiment.

The pattern sensor 7 corresponding to a light detector is arranged in the vicinity of the intermediate transfer belt 5. The pattern sensor 7 is fixed to a fixing portion 209 with screws 208 (FIG. 11A). The pattern sensor 7 is fixed to the image forming apparatus 100 through intermediation of the fixing portion 209 in such a manner that a distance between the pattern sensor 7 and the intermediate transfer belt 5 is set equal to a predetermined distance to focus on a surface of the intermediate transfer belt 5. The pattern sensor 7 is configured to detect density detection patterns and color misregistration detection patterns of the colors, which are formed on the intermediate transfer belt 5, at predetermined timing. The density and the color misregistration are corrected based on a result of detection performed by the pattern sensor 7.

Figure 2:
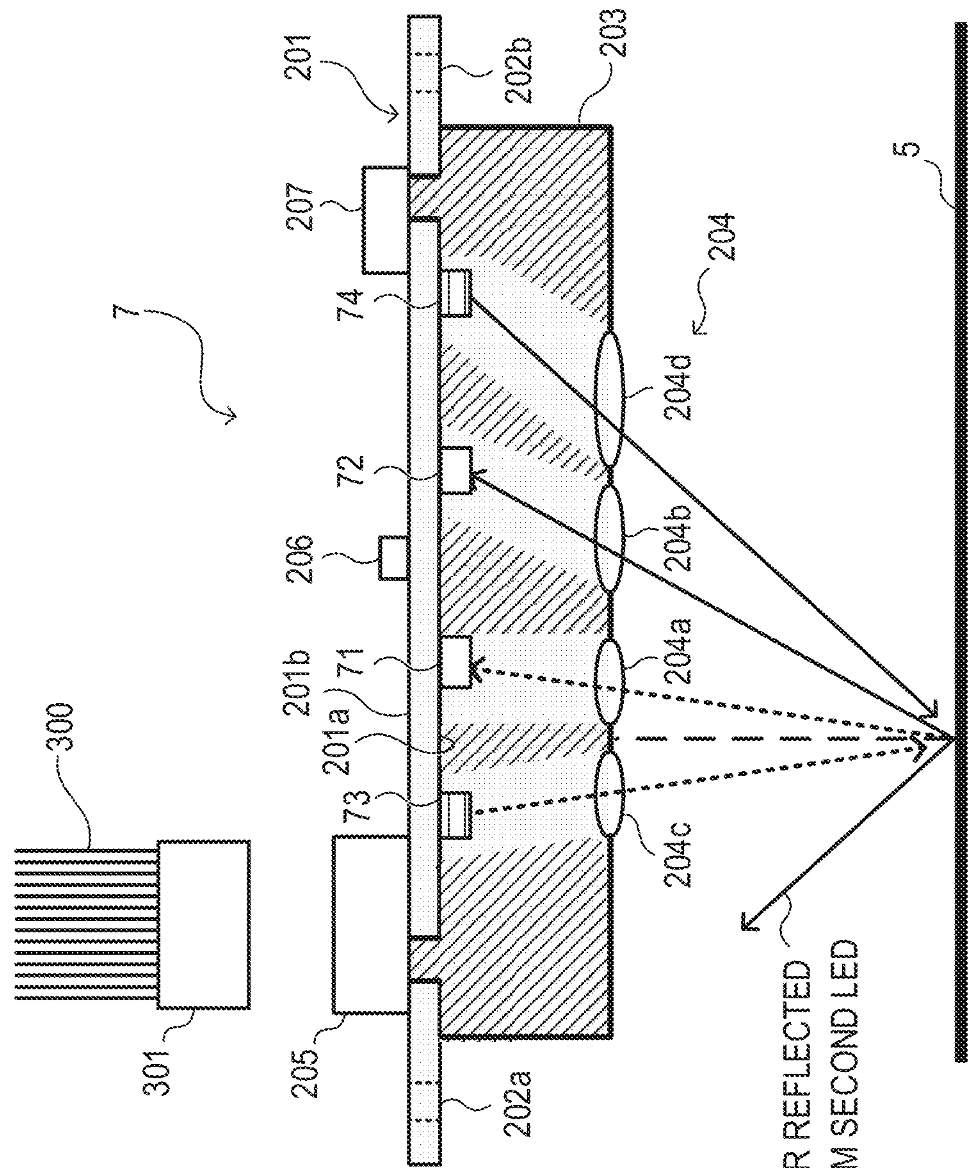
FIG. 2 is an explanatory view of a pattern sensor.

FIG. 2 is an explanatory view of the pattern sensor 7. The pattern sensor 7 includes a circuit board (hereinafter referred to simply as "board") 201. A first photodiode (hereinafter referred to as "first PD") 71 and a second photodiode (hereinafter referred to as "second PD") 72, which correspond to light receiving elements, are mounted on a front side (first side) 201*a* of the board 201. A first light emitting diode (hereinafter referred to as "first LED") 73 and a second light emitting diode (hereinafter referred to as "second LED") 74, which correspond to light emitting elements, are mounted on the front side 201*a* of the board 201. The first PD 71, the second PD 72, the first LED 73, and the second LED 74 are surface-mount elements, and are arranged on one board 201.

A housing 203 configured to cover the first PD 71, the second PD 72, the first LED 73, and the second LED 74 is mounted to the front side 201*a* of the board 201. A lens group 204 including a plurality of lenses 204*a*, 204*b*, 204*c*, and 204*d* is provided to the housing 203. The lenses 204*a*, 204*b*, 204*c*, and 204*d* are arranged in the vicinity of the first PD 71, the second PD 72, the first LED 73, and the second LED 74, respectively. Light guide paths are formed between the lenses 204*a*, 204*b*, 204*c*, and 204*d* and the first PD 71, the second PD 72, the first LED 73, and the second LED 74, respectively, in the housing 203.

Light emitted from the first LED 73 corresponding to a light emitting portion for specular reflected light passes through the light guide path in the housing 203 and the lens 204*c* to travel in a direction of an optical axis (dotted line in FIG. 2) to irradiate the intermediate transfer belt 5. Specular reflected light, which has been specularly reflected by the intermediate transfer belt 5, passes through the lens 204*a* and the light guide path in the housing 203 to be incident on the first PD 71 corresponding to a light receiving portion for specular reflected light (specular reflection color misregistration detection light receiving portion, specular reflection density detection light receiving portion). As illustrated in FIG. 2, the first LED 73 and the first PD 71 are arranged at such positions that an incident angle and a reflection angle of the light from the first LED 73 with respect to the intermediate transfer belt 5 are equal to each other. The first PD 71 functions as a light receiving unit configured to receive the specular reflected light of the light that has been emitted from the first LED 73 to the intermediate transfer belt 5 and reflected by the intermediate transfer belt 5.

Meanwhile, light emitted from the second LED 74 corresponding to a light emitting portion for scattered reflected light passes through the light guide path in the housing 203 and the lens 204*d* and travels in a direction of an optical axis (solid line in FIG. 2) to irradiate the intermediate transfer belt 5. Scattered reflected light, which has been scattered and reflected by the intermediate transfer belt 5, passes through the lens 204*b* and the light guide path in the housing 203 to be incident on the second PD 72 corresponding to a light receiving portion for scattered reflected light (scattered reflected density detection light receiving portion). As illustrated in FIG. 2, the second LED 74 and the second PD 72 are arranged at such positions that an incident angle of light emitted from the first LED 74 and a reflection angle of the scattered reflected light with respect to the intermediate transfer belt 5 are not equal to each other. The second PD 72 functions as a light receiving unit configured to receive the scattered reflected light of the light that has been emitted from the second LED 74 to the intermediate transfer belt 5 and reflected by the intermediate transfer belt 5.

A connector 205, a control integrated circuit (hereinafter referred to as "control IC") 207, and other mounted components 206 are provided on a back side (second side) 201*b* of the board 201, which is opposite to the front side 201*a*. The control IC 207 includes a core chip, which is an integrated circuit, and the core chip is connected onto the board 201 by a chip-on-board method through wire bonding. A sealing resin is applied onto the control IC 207 so as to protect the core chip and the wire bonding. The control IC 207 controls operation of each of the first PD 71, the second PD 72, the first LED 73, and the second LED 74, which are optical elements.

The connector 205 for the pattern sensor 7 is connected to a connector 301 for a cable 300. The pattern sensor 7 is electrically connected to a CPU 109 (FIG. 3), which is configured to control the whole image forming apparatus 100, via the cable 300 connected to the connector 205. The control IC 207 communicates with the CPU 109 to control light emission amounts of the first LED 73 and the second LED 74. The other mounted components 206 include, for example, a capacitor configured to stabilize power to be supplied to the control IC 207. The board 201 has a first positioning hole 202*a* and a second positioning hole 202*b*, which are openings for allowing passage of the screws 208 (FIG. 11A) configured to fix the pattern sensor 7 to the fixing portion 209 provided to the image forming apparatus 100.

Electrical Configuration of Image Forming Apparatus

Figure 3:
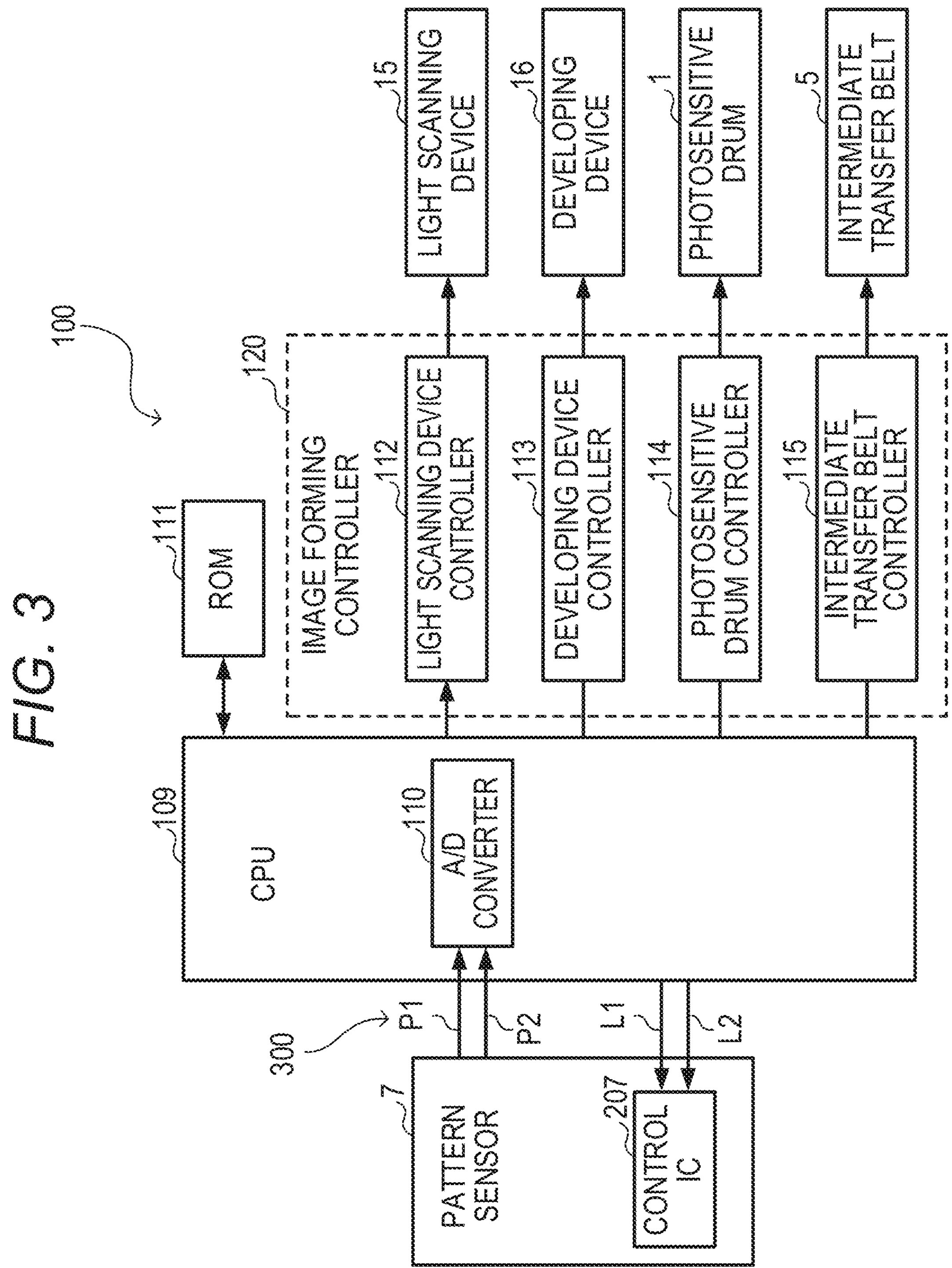
FIG. 3 is a block diagram for illustrating an electrical configuration of the image forming apparatus.

FIG. 3 is a block diagram for illustrating an electrical configuration of the image forming apparatus 100. The image forming apparatus 100 includes the CPU 109, a ROM 111, and an image forming controller 120, which correspond to control units. The cable 300 is configured to electrically connect the pattern sensor 7 and the CPU 109 to each other. The cable 300 includes signal lines. The CPU 109 outputs a first light emission signal L1 and a second light emission signal L2 to the control IC 207 to control lighting of the first LED 73 and the second LED 74 of the pattern sensor 7. The pattern sensor 7 is configured to convert light reception amounts of the first PD 71 and the second PD 72, which are configured to receive reflected light from the intermediate transfer belt 5 or a toner pattern formed on the intermediate transfer belt 5, into voltages, and output the voltages as a first detection signal P1 and a second detection signal P2. After conversion from the analog signals into digital signals through an analog-digital converter (hereinafter referred to as "A/D converter") 110 that is built in the CPU 109, the first detection signal P1 and the second detection signal P2 are input to the CPU 109.

The image forming controller 120 includes a light scanning device controller 112, a developing device controller 113, a photosensitive drum controller 114, and an intermediate transfer belt controller 115. The light scanning device controller 112 is configured to control the light scanning devices 15. The developing device controller 113 is configured to control the developing devices 16. The photosensitive drum controller 114 is configured to control the photosensitive drums 1. The intermediate transfer belt controller 115 is configured to control the intermediate transfer belt 5. The CPU 109 is electrically connected to the light canning device controller 112, the developing device controller 113, the photosensitive drum controller 114, the intermediate transfer belt controller 115, and the ROM 111.

The CPU 109 is configured to control the whole image forming apparatus 100 in accordance with various instructions. The CPU 109 executes an image forming operation in accordance with a program stored in the ROM 111. The CPU 109 causes the image forming controller 120 to control the light scanning devices 15, the developing devices 16, the photosensitive drums 1, and the intermediate transfer belt 5 to form the toner image on the intermediate transfer belt 5. Further, the CPU 109 forms a toner density detection toner pattern (hereinafter referred to as "density detection pattern image") on the intermediate transfer belt 5 in accordance with toner density detection image data stored in the ROM 111. Further, the CPU 109 forms a color misregistration detection toner pattern (hereinafter referred to as "color misregistration detection pattern image") on the intermediate transfer belt 5 in accordance with color misregistration detection image data stored in the ROM 111.

When a color misregistration amount is to be detected, the CPU 109 turns on the first LED 73 of the pattern sensor 7. The first LED 73 illuminates the intermediate transfer belt 5 and the color misregistration detection pattern image formed on the intermediate transfer belt 5. The first PD 71 receives the reflected light from the intermediate transfer belt 5 and the color misregistration detection pattern image formed on the intermediate transfer belt 5, and outputs the first detection signal P1 to the A/D converter 110. The A/D converter 110 converts the first detection signal P1, which is the analog signal, into the digital signal (digital value). The CPU 109 detects the color misregistration amount from the digital signal of the first detection signal P1. The CPU 109 calculates a correction amount for the color misregistration amount based on the color misregistration amount (result of detection). The CPU 109 corrects the color misregistration amount based on the calculated correction amount.

When the toner density is to be detected, the CPU 109 turns on the first LED 73 and the second LED 74 of the pattern sensor 7. The first LED 73 and the second LED 74 illuminate the intermediate transfer belt 5 and the density detection pattern image formed on the intermediate transfer belt 5. The first PD 71 and the second PD 72 receive the reflected light from the intermediate transfer belt 5 and the density detection pattern image formed on the intermediate transfer belt 5, and output the first detection signal P1 and the second detection signal P2 to the A/D converter 110. The A/D converter 110 converts the first detection signal P1 and the second detection signal P2, which are the analog signals, into digital signals (digital values). The CPU 109 detects a level of a toner density from the digital signals of the first detection signal P1 and the second detection signal P2. The CPU 109 calculates a correction amount for the toner density based on the level of the toner density (result of detection). The CPU 109 corrects the toner density based on the calculated correction amount.

Color Misregistration Detection Pattern Image

Figure 4:
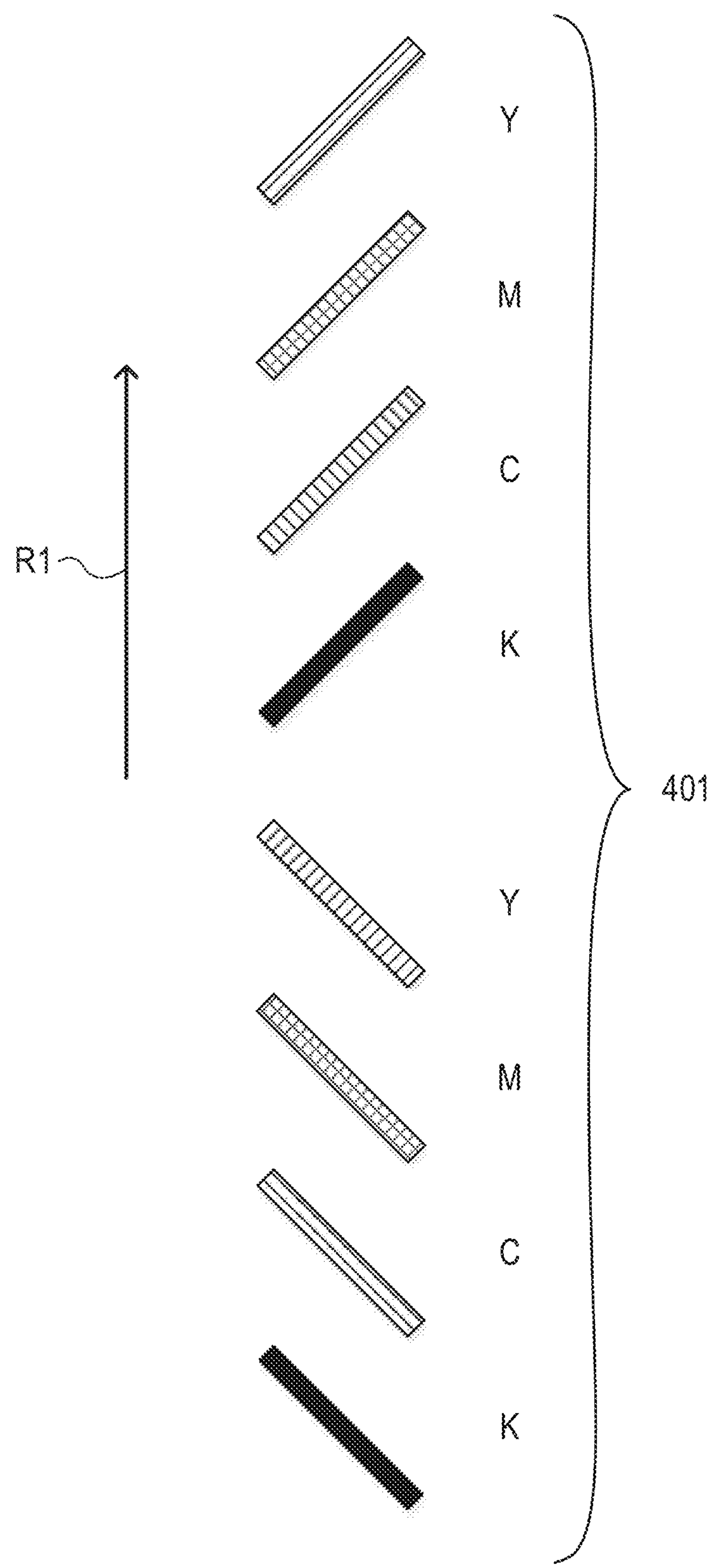
FIG. 4 is a view for illustrating a color misregistration detection pattern image.

Next, the color misregistration detection pattern image to be formed on the intermediate transfer belt 5 when the CPU 109 executes color misregistration detection is described. FIG. 4 is a view for illustrating a color misregistration detection pattern image 401. The color misregistration detection pattern image 401 includes two sets of toner patterns of yellow (Y), magenta (M), cyan (C), and black (K). One set of the toner patterns of yellow (Y), magenta (M), cyan (C), and black (K) is inclined at 45 degrees with respect to the moving direction R1 of the intermediate transfer belt 5. Another set of the toner patterns of yellow (Y), magenta (M), cyan (C), and black (K) is inclined at −45 degrees with respect to the moving direction R1 of the intermediate transfer belt 5.

Figure 5:
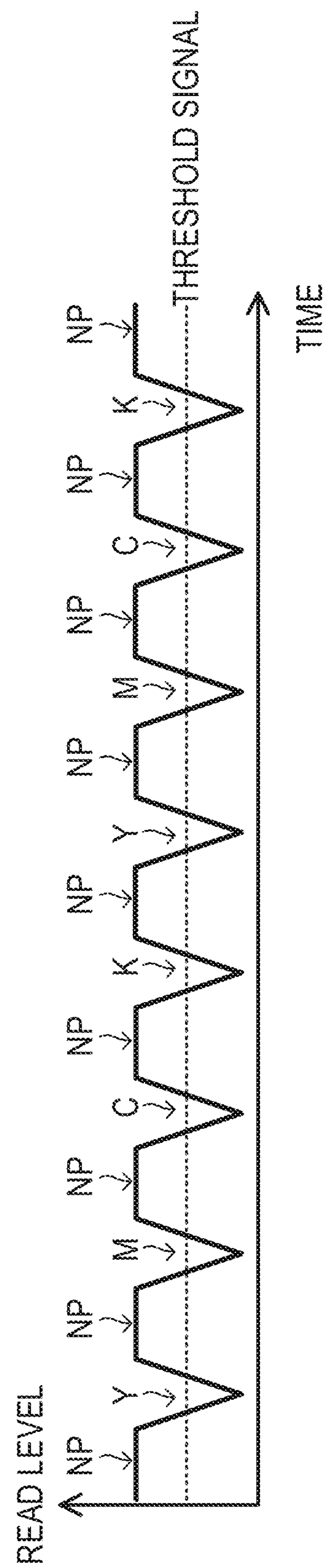
FIG. 5 is a graph for showing an output waveform from a pattern sensor that has detected the color misregistration detection pattern image.

FIG. 5 is a graph for showing an output waveform from the pattern sensor 7 that has detected the color misregistration detection pattern image 401. A reflectance at the surface of the intermediate transfer belt 5 is high in non-patterned portions NP in which an underlayer portion of the intermediate transfer belt 5 is visible. Thus, a read level of the first detection signal P output from the first PD 71 that receives the specular reflected light is high. Meanwhile, the reflectance is low due to the presence of the toners in pattern formation regions having the pattern images of yellow (Y), magenta (M), cyan (C), and black (K) formed thereon. Thus, the read level of the first detection signal P1 output from the first PD 71 that receives the specular reflected light is low. Thus, as shown in FIG. 5, the color misregistration amount can be detected by detecting positions of the toner patterns of yellow (Y), magenta (M), cyan (C), and black (K) with use of a threshold signal. The CPU 109 corrects color misregistration by controlling write timing of the light scanning devices 15 through the light scanning device controller 112 based on the detected color misregistration amount.

Figure 6A:
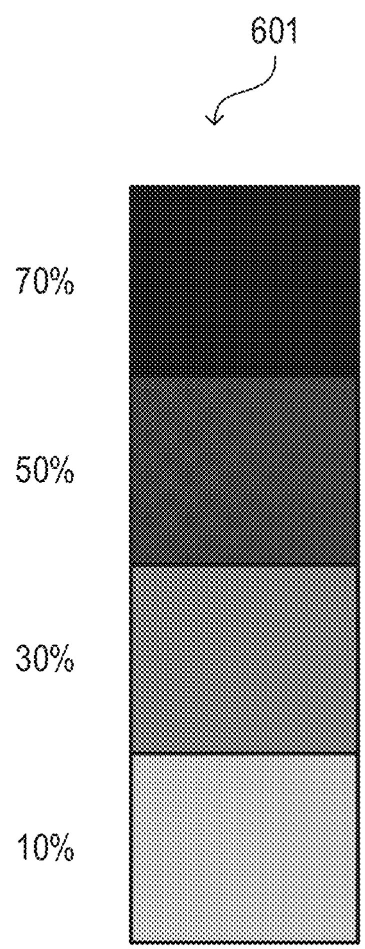
FIG. 6A and FIG. 6B are views for illustrating density detection pattern images.
Figure 6B:
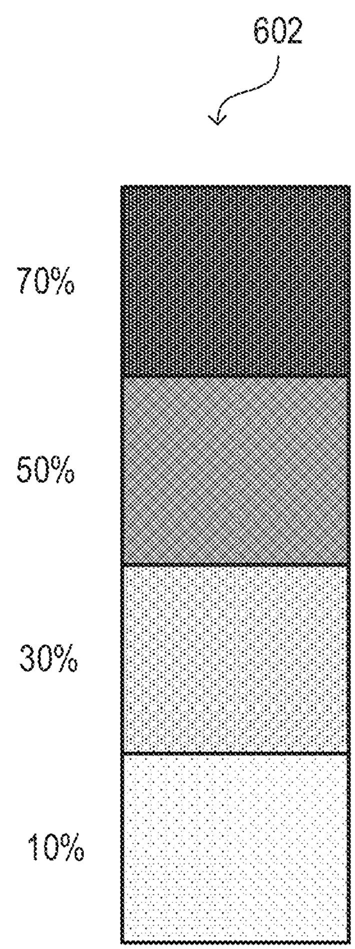

Next, the density detection pattern image to be formed on the intermediate transfer belt 5 when the CPU 109 executes density detection is described. FIG. 6A and FIG. 6B are views for illustrating density detection pattern images. FIG. 6A is a view for illustrating a first density detection pattern image 601 to be formed on the intermediate transfer belt 5 for toner density detection. The first density detection pattern image 601 is used to cause the first PD 71 to receive the specular reflected light of the light emitted from the first LED 73. The first density detection pattern image 601 is formed with a black (K) toner, and is used when black (K) toner density detection is executed. Black (K) has a light absorbing property, and thus cannot be detected based on scattered reflected light. Thus, the toner density of black is detected by using the result of detection performed by the first PD 71 that receives the specular reflected light.

The first density detection pattern image 601 illustrated in FIG. 6A includes four grayscale patterns of 70%, 50%, 30%, and 10% in order of decreasing density. The CPU 109 reads the first density detection pattern image 601 formed on the intermediate transfer belt 5 with use of the pattern sensor 7 to obtain the first detection signal P1 from the first PD 71. The CPU 109 converts the first detection signal P1 into the digital signal through the A/D converter 110, computes a difference between a value of the digital signal and an image density grayscale characteristic to be actually output, and controls the image forming controller 120 based on a result of computation to thereby perform density correction.

Figure 7:
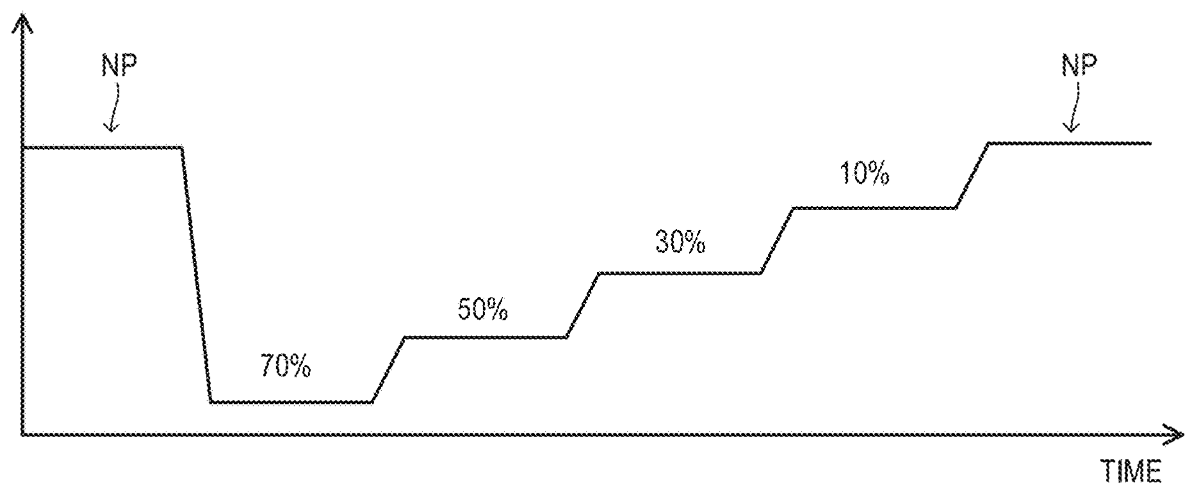
FIG. 7 is a graph for showing an output waveform from the pattern sensor that has detected a first density detection pattern image.

FIG. 7 is a graph for showing an output waveform from the pattern sensor 7 that has detected the first density detection pattern image 601. The light emitted from the first LED 73 is absorbed by the black (K) toner in a 70%-portion having a high density. Further, the 70%-portion has a large toner application amount of the black (K) toner, and hence the specular reflected light from the intermediate transfer belt 5 also decreases. Thus, the read level at the 70%-portion having a high density is low. Meanwhile, a light absorption amount by the black (K) toner in a 10%-portion having a low density is smaller than a light absorption amount in the 70%-portion. Further, the 10%-portion has a small toner application amount of the black (K) toner, and hence the specular reflected light from the intermediate transfer belt 5 increases. Thus, the read level at the 10%-portion having a low density is high. The first density detection pattern image 601 is not formed on non-patterned portions NP, and the specular reflected light from the intermediate transfer belt 5 is large in the non-patterned portions NP. Thus, the read level is high.

FIG. 6B is a view for illustrating a second density detection pattern image 602 to be formed on the intermediate transfer belt 5 for toner density detection. The second density detection pattern image 602 is used to cause the second PD 72 to receive scattered reflected light of the light emitted from the second LED 74. The second density detection pattern image 602 is formed with a yellow (Y) toner, a magenta (M) toner, and a cyan (C) toner, and is used at a time of execution of yellow (Y) toner density detection, magenta (M) toner density detection, and cyan (C) toner density detection. FIG. 6B shows the second density detection pattern image 602 formed with the toner of one color of yellow (Y), magenta (M), and cyan (C). Yellow (Y), magenta (M), and cyan (C) have higher scattering coefficients than that of the intermediate transfer belt 5. Thus, toner densities of yellow (Y), magenta (M), and cyan (C) are detected by using a result of detection performed by the second PD 72 that receives the scattered reflected light.

The second density detection pattern image 602 illustrated in FIG. 6B includes four grayscale patterns of 70%, 50%, 30%, and 10% in order of decreasing density. The CPU 109 reads the second density detection pattern image 602 formed on the intermediate transfer belt 5 with use of the pattern sensor 7 to obtain the second detection signal P2 from the second PD 72. The CPU 109 converts the second detection signal P2 into the digital signal through the A/D converter 110, computes a difference between a value of the digital signal and an image density grayscale characteristic to be actually output, and controls the image forming controller 120 based on a result of computation to thereby perform density correction.

Figure 8:
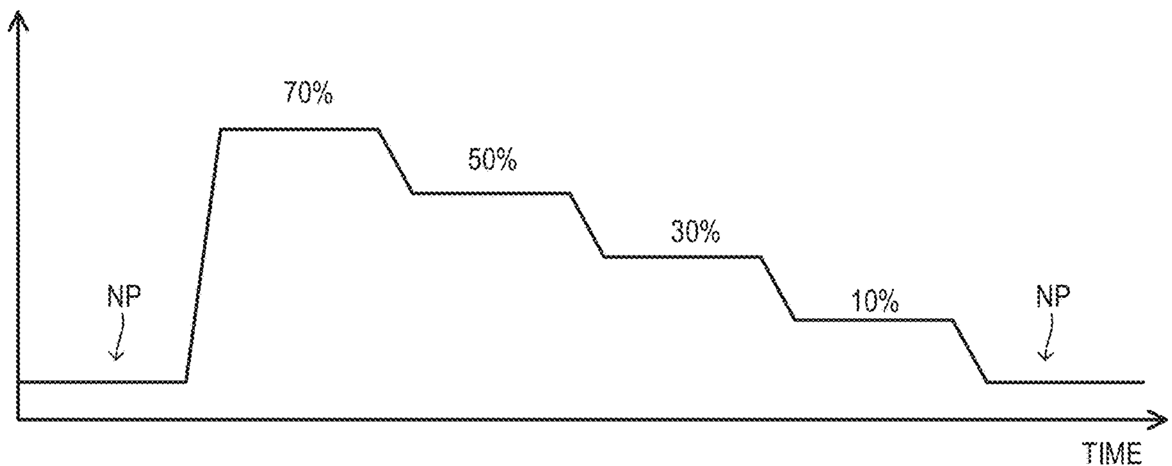
FIG. 8 is a graph for showing an output waveform from the pattern sensor that has detected a second density detection pattern image.

FIG. 8 is a graph for showing an output waveform from the pattern sensor 7 that has detected the second density detection pattern image 602. A case in which the second density detection pattern image 602 is formed with the yellow (Y) toner is described. The light emitted from the second LED 74 is absorbed by the yellow (Y) toner in the 70%-portion having a high density. Further, the 70%-portion has a large toner application amount of the yellow (Y) toner, and hence the scattered reflected light from the yellow (Y) toner also increases. Thus, the read level at the 70%-portion having a high density is high. Meanwhile, a reflectance of the yellow (Y) toner at the 10%-portion having a low density is smaller than that at the 70%-portion, and thus the scattered reflected light decreases. Hence, the read level at the 10%-portion having a low density is low. The second density detection pattern image 602 is not formed on the non-patterned portions NP, and the amount of scattered reflected light from the intermediate transfer belt 5 is small. Thus, the read level is low at the 10%-portion. The toner density detection for the magenta (M) toner and the cyan (C) toner are executed in the same manner as that of the toner density detection for the yellow (Y) toner.

Arrangement of Components Mounted on Pattern Sensor

Figure 9A:
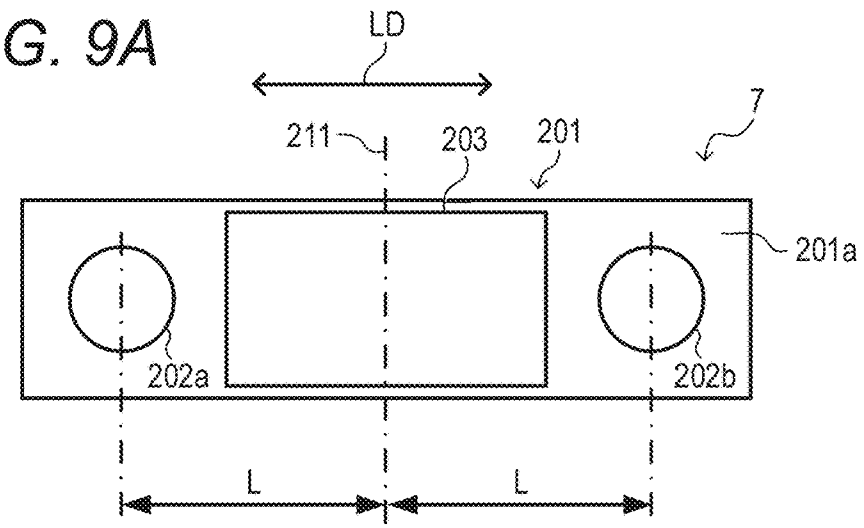
FIG. 9A, FIG. 9B, and FIG. 9C are views for illustrating arrangement of a housing and a connector, which are mounted on the pattern sensor.
Figure 9B:
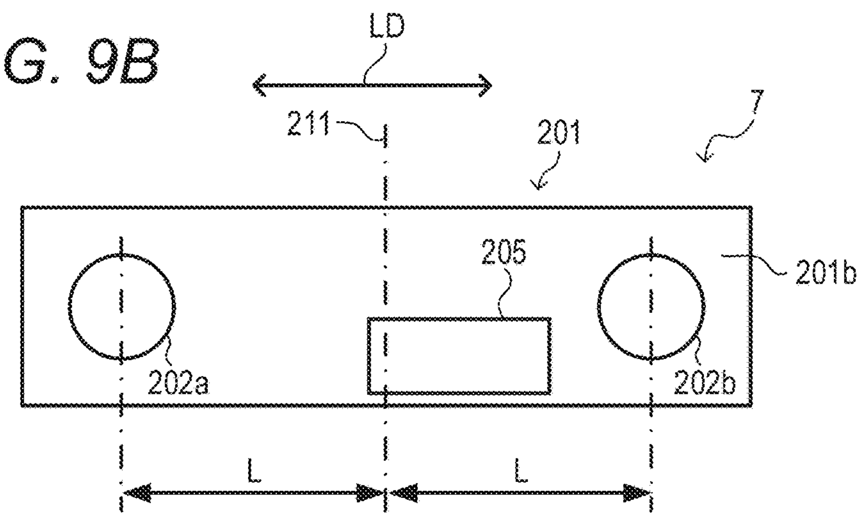
Figure 9C:
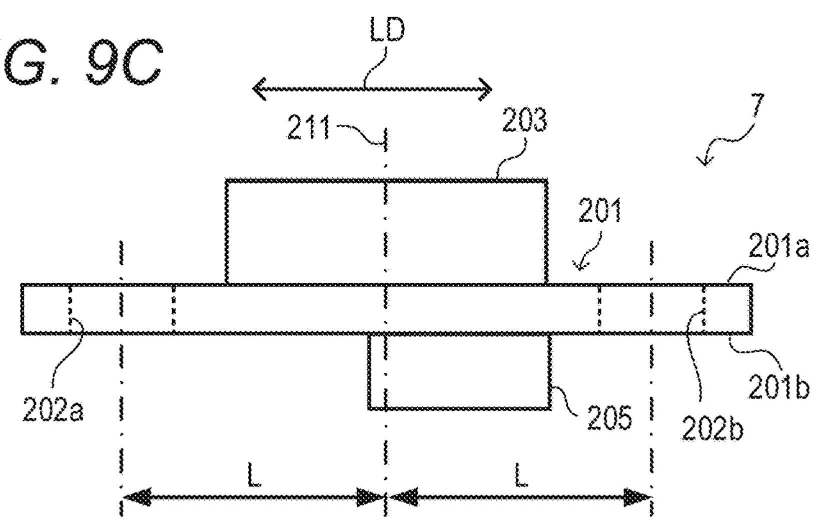

Next, arrangement of the components mounted on the pattern sensor 7 is described with reference to FIG. 9A, FIG. 9B, and FIG. 9C. FIG. 9A, FIG. 9B, and FIG. 9C are views for illustrating arrangement of the housing 203 and the connector 205, which are mounted on the pattern sensor 7. FIG. 9A is a view for illustrating the front side 201*a* of the board 201 of the pattern sensor 7. The housing 203 is arranged on the front side 201*a* of the board 201. FIG. 9B is a view for illustrating the back side 201*b* of the board 201. The connector 205 is arranged on the back side 201*b* of the board 201. FIG. 9C is a view for illustrating a side surface of the pattern sensor 7.

The first positioning hole 202*a* and the second positioning hole 202*b* are formed in both end portions of the board 201 in a longitudinal direction LD. Each of the first positioning hole 202*a* and the second positioning hole 202*b* is located at a distance L from a center 211 of the board 201 in the longitudinal direction LD. Specifically, the center 211 of the board 201 is located in the middle between the first positioning hole 202*a* and the second positioning hole 202*b* in the longitudinal direction LD of the board 201. The housing 203 is arranged on the front side 201*a* of the board 201. The connector 205 is arranged on the back side 201*b* of the board 201. The connector 205 is arranged at such a position as to be asymmetric with respect to the center 211 of the board 201 in the longitudinal direction LD. In this embodiment, the connector 205 is arranged at a position shifted from the center 211 toward the second positioning hole 202*b*.

Fixing Portion of Comparative Example

The pattern sensor 7 is fixed to the image forming apparatus 100 through intermediation of the fixing portion 209 (FIG. 1). Before a description of the fixing portion 209 (FIG. 1) of a first embodiment is given, a fixing portion 1209 of a comparative example is described with reference to FIG. 10A, FIG. 10B, FIG. 10C, and FIG. 10D. FIG. 10A, FIG. 10B, FIG. 10C, and FIG. 10D are explanatory views of mounting of the pattern sensor 7 to the fixing portion 1209 of the comparative example. The pattern sensor 7 includes the board 201 having surfaces on both of which the components are mounted. Thus, an opening portion 1210 is formed in the fixing portion 1209 so as to fix the pattern sensor 7 to the fixing portion 1209.

Figure 10A:
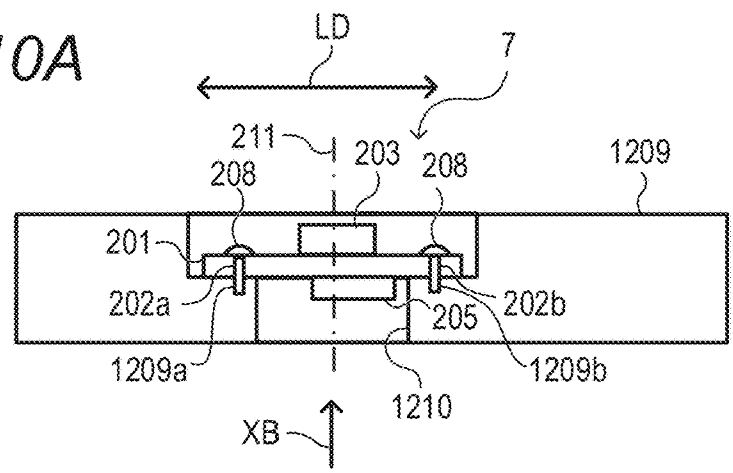
FIG. 10A, FIG. 10B, FIG. 10C, and FIG. 10D are explanatory views of mounting of the pattern sensor to a fixing portion of a comparative example.
Figure 10B:
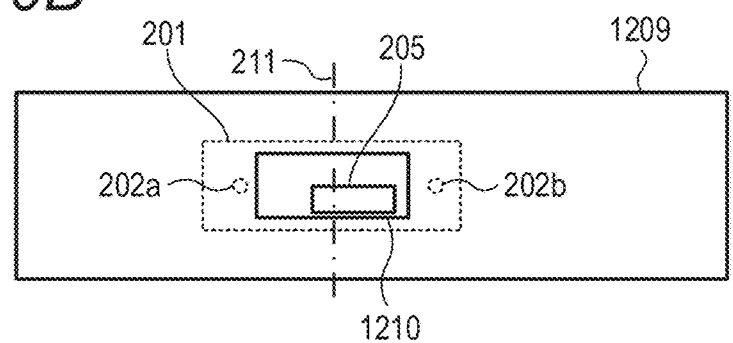

FIG. 10A is a sectional view of the fixing portion 1209 to which the pattern sensor 7 is mounted in a correct orientation. FIG. 10B is a view for illustrating the fixing portion 1209 when viewed in a direction indicated by an arrow XB in FIG. 10A. The connector 205 is inserted into the opening portion 1210, and is arranged at a position shifted toward the right with respect to the center 211 of the board 201. The first positioning hole 202*a* and the second positioning hole 202*b* of the board 201 are aligned with a first screw hole 1209*a* and a second screw hole 1209*b* of the fixing portion 1209, respectively, and the pattern sensor 7 is fixed to the fixing portion 1209 with the screws 208.

Figure 10C:
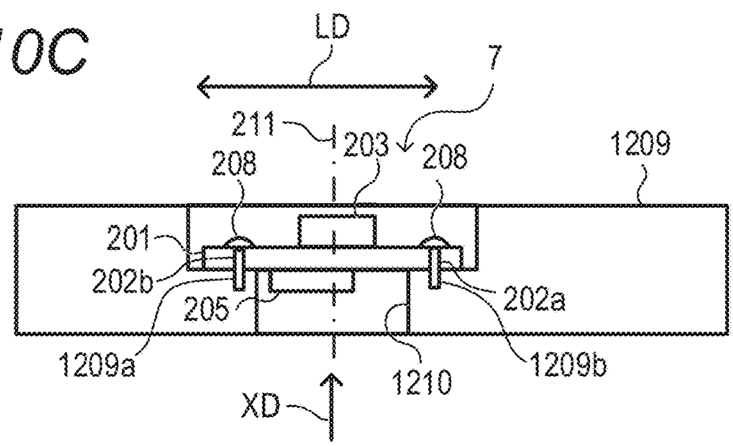
Figure 10D:
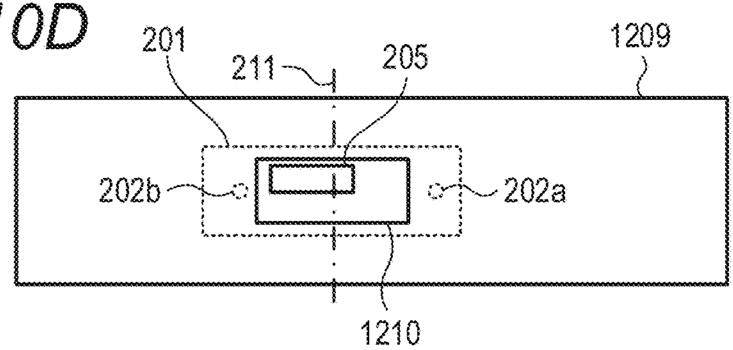

FIG. 10C is a sectional view of the fixing portion 1209 to which the pattern sensor 7 is mounted in an opposite orientation. FIG. 10D is a view for illustrating the fixing portion 1209 when viewed in a direction indicated by an arrow XD in FIG. 10C. The connector 205 is inserted into the opening portion 1210, and is arranged at a position shifted with respect to the center 211 of the board 201. The first positioning hole 202*a* and the second positioning hole 202*b* of the board 201 are aligned with a second screw hole 1209*b* and a first screw hole 1209*a* of the fixing portion 1209, respectively, and the pattern sensor 7 is fixed to the fixing portion 1209 with the screws 208. In this manner, even when the pattern sensor 7 is placed in an incorrect orientation, the board 201 can be fixed to the fixing portion 1209 of the comparative example.

The fixing portion 1209 of the comparative example, which is illustrated in FIG. 10A, FIG. 10B, FIG. 10C, and FIG. 10D, has the opening portion 1210 that is relatively large. The opening portion 1210 passes through a portion of the fixing portion 1209 other than portions for supporting the first positioning hole 202*a* and the second positioning hole 202*b* of the board 201. As illustrated in FIG. 10A, FIG. 10B, FIG. 10C, and FIG. 10D, the pattern sensor 7 can be mounted to the fixing portion 1209 regardless of whether the pattern sensor 7 is oriented rightward or leftward in the longitudinal direction LD of the board 201 with respect to the center 211 of the board 201. Thus, the pattern sensor 7 can be fixed to the fixing portion 1209 even when the pattern sensor 7 is placed in an incorrect orientation. When the pattern sensor 7 is fixed to the fixing portion 1209 after being placed in an incorrect orientation, the misassembling cannot be noticed until electrical connection to the pattern sensor 7 is established to cause the first LED 73 or the second LED 74 to emit light to execute an inspection in an inspection step. Thus, rework is required in an assembly step and the inspection step. Thus, productivity in assembly is reduced.

Fixing Portion of First Embodiment

Figure 11B:
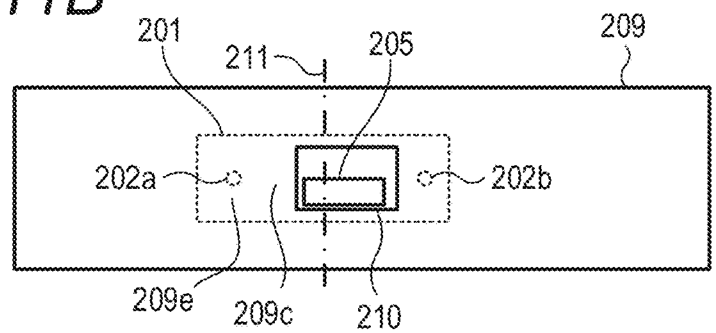

In addressing issues regarding the fixing portion 1209 of the comparative example, the fixing portion 209 of the first embodiment has the following configuration. FIG. 11A, FIG. 11B, FIG. 11C, and FIG. 11D are explanatory views of mounting of the pattern sensor 7 to the fixing portion 209 of the first embodiment. FIG. 11A is a sectional view of the fixing portion 209 to which the pattern sensor 7 is mounted in a correct orientation. FIG. 11B is a view of the fixing portion 209 when viewed in a direction indicated by an arrow XIB in FIG. 11A. An opening portion (through-hole) 210 is formed in the fixing portion 209 so as to fix the pattern sensor 7 to the fixing portion 209. In FIG. 9A, FIG. 9B, FIG. 9C, FIG. 10A. FIG. 10B, FIG. 10C, FIG. 10D, FIG. 11A, FIG. 11B, FIG. 11C, and FIG. 11D, an illustration of the control IC 207 and the other mounted component 206 on the pattern sensor 7 is omitted. Similarly to the connector 205, the control IC 207 and the other mounted component 206 are arranged at such positions that allow insertion of the control IC 207 and the other mounted components 206 into the opening portion 210.

The fixing portion 209 has an extension portion 209*c*. The extension portion 209*c* extends from a support portion 209*e* in a direction toward the center 211 of the board 201 to a position at which interference with the connector 205 does not occur. The support portion 209*e* is configured to support an end portion (portion) of the board 201, in which the first positioning hole 202*a* is formed. The extension portion 209*c* is formed integrally with the fixing portion 209. However, the extension portion 209*c* may be formed as a separate part from the fixing portion 209. A member for forming the extension portion 209*c* may be different from a member for forming the support member 209*e*. Further, the pattern sensor 7 is placed in a first orientation on the fixing portion 209, in which the first positioning hole 202*a* is aligned with a first screw hole 209*a* of the fixing portion 209 and the second positioning hole 202*b* is aligned with a second screw hole 209*b* of the fixing portion 209. When the pattern sensor 7 is placed in the first orientation on the fixing portion 209, the connector 205 is inserted into the opening portion 210 without being interfered with by the extension portion 209*c*, and is arranged in such a manner as to be shifted toward the right with respect to the center 211 of the board 201. One of the screws 208 is screwed into the first screw hole 209*a* through the first positioning hole 202*a*, and another one of the screws 208 is screwed into the second screw hole 209*b* through the second positioning hole 202*b*, to thereby fix the pattern sensor 7 to the fixing portion 209. The fixing portion 209 may be made of a resin material or a metal material such as a sheet metal.

Figure 11C:
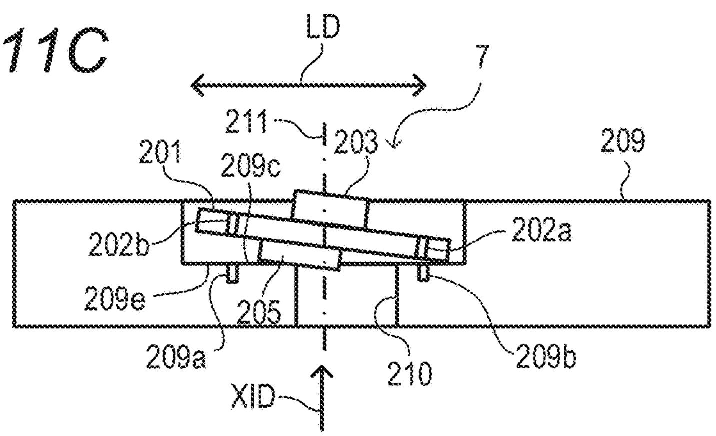
Figure 11D:
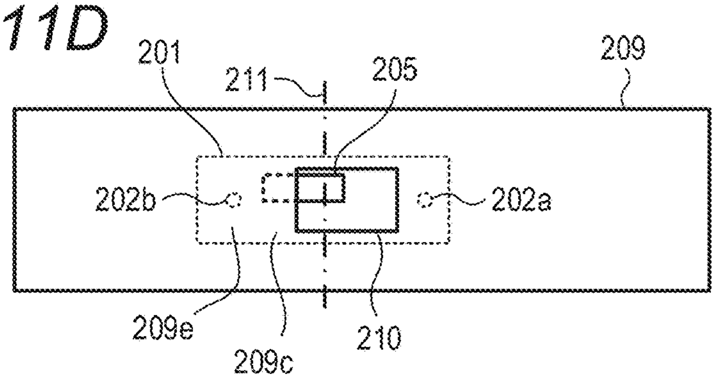

FIG. 11C is a sectional view of the fixing portion 209 to which the pattern sensor 7 is to be mounted in an opposite orientation. FIG. 11D is a view of the fixing portion 209 when viewed in a direction indicated by an arrow XID in FIG. 11C. The pattern sensor 7 is placed in a second orientation on the fixing portion 209, in which the first positioning hole 202*a* is aligned with the second screw hole 209*b* of the fixing portion 209 and the second positioning hole 202*b* is aligned with the first screw hole 209*a* of the fixing portion 209. When the pattern sensor 7 is to be mounted in an incorrect orientation on the fixing portion 209, the connector 205 physically interferes with the extension portion 209*c* that forms a part of an edge portion of the opening portion 210. The interference occurs because the opening portion 210 and the connector 205 are arranged asymmetrically with respect to the center 211 of the board 201 in the longitudinal direction LD. When the pattern sensor 7 is placed in the second orientation on the fixing portion 209, the connector 205 is interfered with by the extension portion 209*c*, and cannot be inserted into the opening portion 210. When the first positioning hole 202*a* and the second positioning hole 202*b* of the board 201 are to be aligned with the second screw hole 209*b* and the first screw hole 209*a* of the fixing portion 209, respectively, to fix the pattern sensor 7 with the screws 208, the pattern sensor 7 cannot be fixed because the connector 205 interferes with the extension portion 209*c*. The interference allows a worker to notice the incorrect orientation of the pattern sensor 7 with respect to the fixing portion 209.

According to the first embodiment, the fixing of the pattern sensor 7 placed in an incorrect orientation to the fixing portion 209 can be prevented. According to the first embodiment, malfunction of the image forming apparatus 100 and erroneous detection by the image forming apparatus 100 due to imprecise detection, which may be caused by an incorrect orientation of the pattern sensor 7, are prevented. Thus, waste time for rework required due to misassembling of the pattern sensor 7 to the fixing portion 209 is eliminated to enable improvement of productivity.

Second Embodiment

Now, a second embodiment is described. In the second embodiment, the same structures as those in the first embodiment are denoted by the same reference symbols, and a description thereof is omitted. The image forming apparatus 100 and an electrical configuration thereof in the second embodiment are the same as those in the first embodiment, and thus a description thereof is omitted. A pattern sensor 17 of the second embodiment includes components having the same functions as those of the components of the pattern sensor 7 of the first embodiment. However, arrangement of the components is different from that in the first embodiment. A fixing portion 219 of the second embodiment is different from the fixing portion 209 of the first embodiment. Differences are mainly described below.

Arrangement of Components Mounted on Pattern Sensor

Figure 12A:
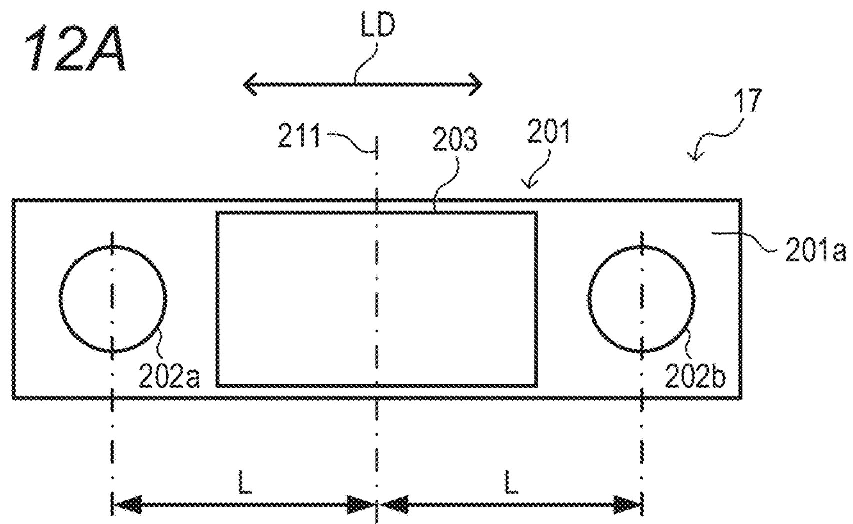
FIG. 12A, FIG. 12B, and FIG. 12C are views for illustrating arrangement of components mounted on a pattern sensor of a second embodiment.
Figure 12B:
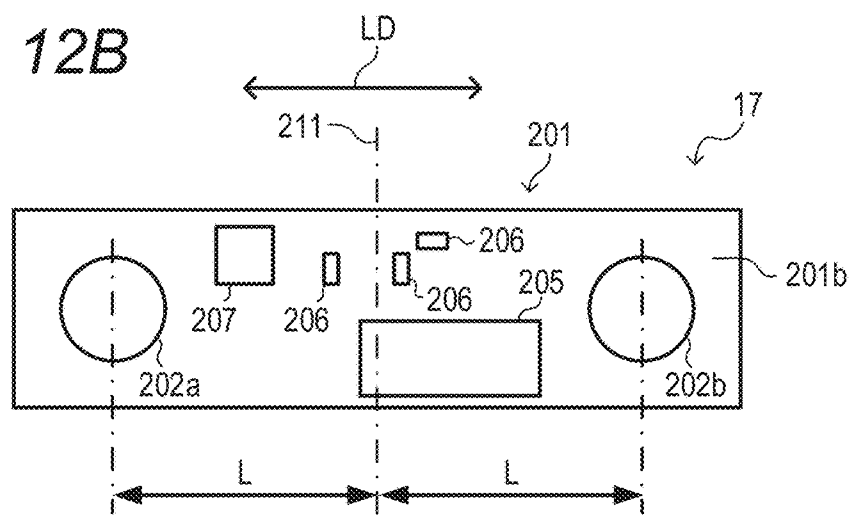
Figure 12C:
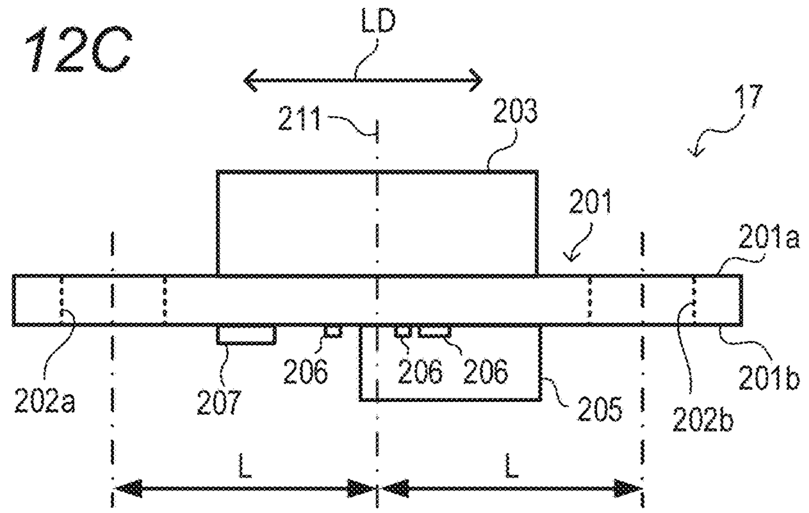

Next, arrangement of the components mounted on the pattern sensor 17 is described with reference to FIG. 12A, FIG. 12B, and FIG. 12C. FIG. 12A, FIG. 12B, and FIG. 12C are views for illustrating the arrangement of the components mounted on the pattern sensor 17 of the second embodiment. FIG. 12A is a view for illustrating the front side 201*a* of the board 201 of the pattern sensor 17. FIG. 12B is a view for illustrating the back side 201*b* of the board 201. FIG. 12C is a view for illustrating a side surface of the pattern sensor 17.

The board 201 has the first positioning hole 202*a* and the second positioning hole 202*b*, which are formed in both end portions of the board 201 in the longitudinal direction LD. Each of the first positioning hole 202*a* and the second positioning hole 202*b* is located at the distance L from the center 211 of the board 201 in the longitudinal direction LD. Specifically, the center 211 is located in the middle between the first positioning hole 202*a* and the second positioning hole 202*b* in the longitudinal direction LD of the board 201. The housing 203 is arranged on the front side 201*a* of the board 201. The connector 205, the control IC 207, and the other mounted components 206 are arranged on the back side 201*b* of the board 201. The connector 205 is arranged at such a position as to be asymmetric with respect to the center 211 of the board 201 in the longitudinal direction LD. In this embodiment, the connector 205 is arranged at a position shifted toward the second positioning hole 202*b* from the center 211.

The control IC 207 and the other mounted components 206 are arranged on the back side 201*b*, which is the same surface as the surface on which the connector 205 is arranged. On the pattern sensor 17 illustrated in FIG. 12A, FIG. 12B, and FIG. 12C, the control IC 207 is arranged on a side (on the left in FIG. 12B) opposite to the side where the connector 205 is arranged with respect to the center 211. When the pattern sensor 17 of the second embodiment is to be built into the fixing portion 209 of the first embodiment, which is illustrated in FIG. 11A, FIG. 11B, FIG. 11C, and FIG. 11D, the control IC 207 may interfere with the extension portion 209*c* to be damaged thereby. Also in a case in which the other mounted components 206 are arranged on the side (on the left in FIG. 12B) opposite to the side where the connector 205 is arranged, the other mounted components 206 may similarly interfere with the extension portion 209*c* to be damaged thereby. Thus, in the second embodiment, a height level of the extension portion 209*c* of the fixing portion 209 of the first embodiment is lowered to a height at which the extension portion 209*c* does not interfere with the control IC 207 or the other mounted components 206, and the amount of lowering is set equal to or smaller than a height of the connector 205.

Fixing Portion of Second Embodiment

Figure 13A:
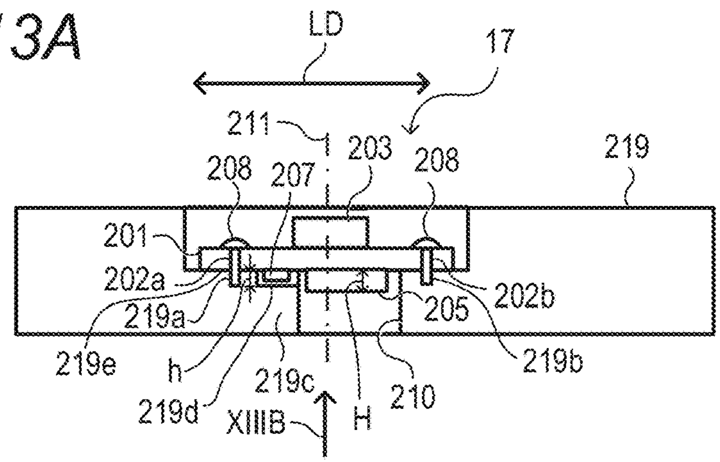
FIG. 13A, FIG. 13B, FIG. 13C, and FIG. 13D are explanatory views of mounting of the pattern sensor to a fixing portion of the second embodiment.
Figure 13B:
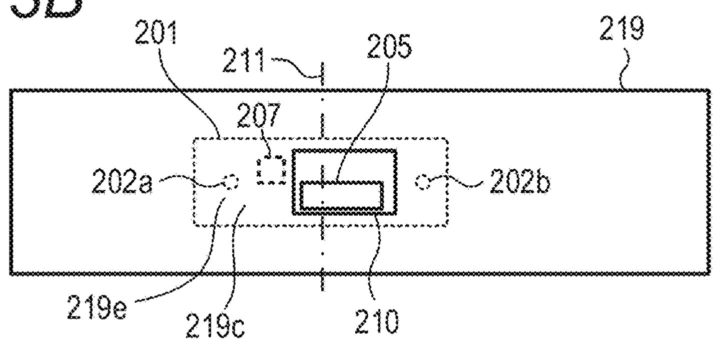

FIG. 13A, FIG. 13B, FIG. 13C, and FIG. 13D are explanatory views of mounting of the pattern sensor 17 to the fixing portion 219 of the second embodiment. FIG. 13A is a sectional view of the fixing portion 219 to which the pattern sensor 17 is mounted in a correct orientation. FIG. 13B is a view of the fixing portion 219 when viewed in a direction indicated by an arrow XIIIB in FIG. 13A. The opening portion (through-hole) 210 is formed in the fixing portion 219 so as to fix the pattern sensor 17 to the fixing portion 219.

The fixing portion 219 has an extension portion 219*c*. The extension portion 219*c* extends from a support portion 219*e* in a direction toward the center 211 of the board 201 to a position at which interference with the connector 205 does not occur. The support portion 219*e* is configured to support the end portion of the board 201, in which the first positioning hole 202*a* is formed. The extension portion 219*c* is formed integrally with the fixing portion 219. However, the extension portion 219*c* may be formed as a separate part from the fixing portion 219. A member for forming the extension portion 219*c* may be formed as a separate member from the support portion 219*e*. The extension portion 219*c* has a recessed portion 219*d* configured to receive the control IC 207 to prevent interference of the control IC 207 provided on the board 201 with the extension portion 219*c*. A depth "h" (the amount of lowering from a support surface of the support portion 219*e*) of the recessed portion 219*d* is smaller than a height H of the connector 205 ($h<H$). The connector 205 is inserted into the opening portion 210, and is arranged at a position shifted toward the right with respect to the center 211 of the board 201. The control IC 207 is received in the recessed portion 219*d*, and is arranged at a position shifted toward the left with respect to the center 211 of the board 201. The first positioning hole 202*a* and the second positioning hole 202*b* of the board 201 are aligned with a first screw hole 219*a* and a second screw hole 219*b* of the fixing portion 219, and the pattern sensor 7 is fixed to the fixing portion 219 with the screws 208. The fixing portion 219 may be made of a resin material or a metal material such as a sheet metal.

Figure 13C:
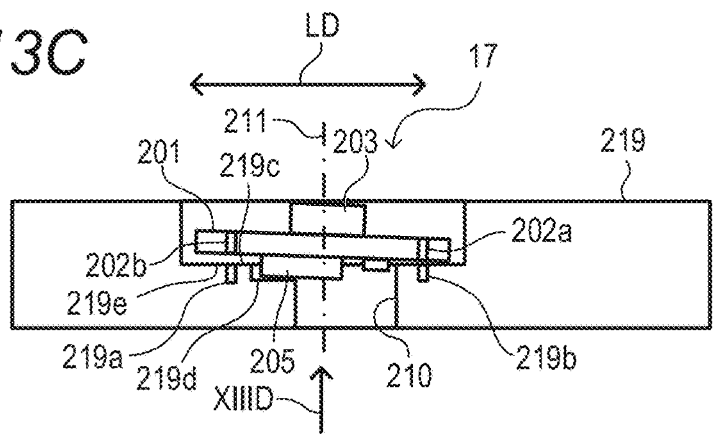
Figure 13D:
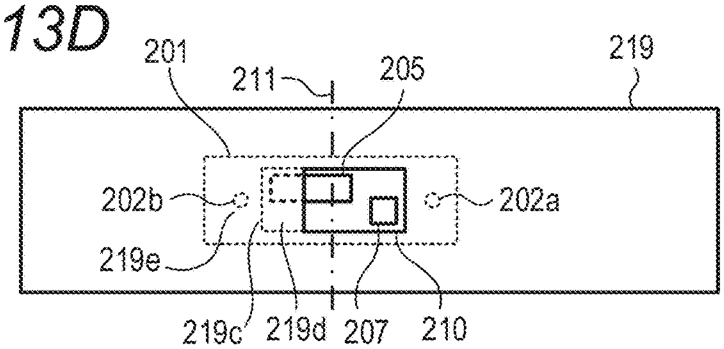

FIG. 13C is a sectional view of the fixing portion 219 to which the pattern sensor 17 is to be mounted in an opposite orientation. FIG. 13D is a view of the fixing portion 219 when viewed in a direction indicated by an arrow XIIID in FIG. 13C. When the pattern sensor 17 is to be mounted in an incorrect orientation on the fixing portion 219, the connector 205 physically interferes with the recessed portion 219*d* formed on the extension portion 219*c*. The interference occurs because the opening portion 210 and the connector 205 are arranged asymmetrically with respect to the center 211 of the board 201 in the longitudinal direction LD, and the depth "h" of the recessed portion 219*d* is smaller than the height H of the connector 205. When the first positioning hole 202*a* and the second positioning hole 202*b* of the board 201 are to be aligned with the second screw hole 219*b* and the first screw hole 219*a* of the fixing portion 219, respectively, to fix the pattern sensor 17 with the screws 208, the pattern sensor 17 cannot be fixed because the connector 205 interferes with the recessed portion 219*d*. The interference allows a worker to notice the incorrect orientation of the pattern sensor 17 with respect to the fixing portion 219.

According to the second embodiment, the fixing of the pattern sensor 17 placed in an incorrect orientation to the fixing portion 219 can be prevented. According to the second embodiment, malfunction of the image forming apparatus 100 and erroneous detection by the image forming apparatus 100 due to imprecise detection, which may be caused by an incorrect orientation of the pattern sensor 17, are prevented. Thus, waste time for rework required due to misassembling of the pattern sensor 17 to the fixing portion 219 is eliminated to enable improvement of productivity.

Each of the pattern sensors 7 and 17 is arranged in the vicinity of the intermediate transfer belt 5 to detect the pattern image formed on the intermediate transfer belt 5 in the first embodiment and the second embodiment. However, each of the pattern sensors (optical sensors) 7 and 17 may be arranged in the vicinity of the photosensitive drums (image bearing members) 1 to detect a pattern image formed on each of the photosensitive drums 1.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-080387, filed Apr. 30, 2020, which is hereby incorporated by reference herein in its entirety.

What is claimed is:

1. An image forming apparatus comprising:
an image bearing member;
an optical sensor configured to detect a pattern image formed on the image bearing member; and
a fixing portion configured to fix the optical sensor,
wherein the optical sensor includes (i) a circuit board having a first positioning hole and a second positioning hole, (ii) a light emitting element and a light receiving element, which are provided on a first side of the circuit board, and (iii) a connector,
wherein the connector is provided on a second side of the circuit board that is opposite to the first side, and the connector is arranged at a position offset from a center between the first positioning hole and the second positioning hole toward the second positioning hole,
wherein the fixing portion includes (i) a first screw hole, (ii) a second screw hole, (iii) a through-hole provided between the first screw hole and the second screw hole, (iv) a support portion configured to support a portion of the circuit board in which the first positioning hole is provided, and (v) an extension portion extending from the support portion toward the through-hole,
wherein, in a case in which the optical sensor is placed on the fixing portion in a first orientation in which the first positioning hole is aligned with the first screw hole and the second positioning hole is aligned with the second screw hole, the connector is inserted into the through-hole without interfering with the extension portion so that the optical sensor is fixed to the fixing portion by screws, and
wherein, in a case in which the optical sensor is placed on the fixing portion in a second orientation in which the first positioning hole is aligned with the second screw hole and the second positioning hole is aligned with the first screw hole, the connector interferes with the extension portion so that the connector is not inserted into the through-hole.

2. The image forming apparatus according to claim 1, wherein the optical sensor is fixed to the fixing portion by a screw screwed into the first screw hole through the first positioning hole and a screw screwed into the second screw hole through the second positioning hole.

3. The image forming apparatus according to claim 1,
wherein the optical sensor further includes a component provided on the second side of the circuit board, and
wherein the fixing portion has a recessed portion into which the component is received in the case in which the optical sensor is placed on the fixing portion in the first orientation.

4. The image forming apparatus according to claim 3, wherein the recessed portion is formed in the extension portion.

5. The image forming apparatus according to claim 3, wherein a depth of the recessed portion from a support surface of the support portion configured to support the portion of the circuit board in which the first positioning hole is provided is smaller than a height of the connector.

6. The image forming apparatus according to claim 1, wherein the extension portion is formed as a separate part from the support portion.

7. An image forming apparatus to form an image on a sheet, the image forming apparatus comprising:
an image bearing member;
an image forming unit configured to form a pattern image on the image bearing member;
an optical sensor fixed on a fixing member and configured to detect reflected light from the pattern image on the image bearing member; and
a controller configured to receive an output signal output from the optical sensor via a signal line, and to control a density of an image to be formed by the image forming unit based on the output signal,
wherein the optical sensor includes:
a substrate,
a light emitting element mounted on a first surface of the substrate,
a light receiving element mounted on the first surface of the substrate, and
a connector mounted on a second surface of the substrate that is opposite to the first surface,
wherein the substrate has a first positioning hole and a second positioning hole and is fixed to the fixing member by screws inserted through the first positioning hole and the second positioning hole,
wherein the connector and the signal line are connected,
wherein a position of the connector on the substrate is offset to a predetermined side from a center between the first positioning hole and the second positioning hole in a longitudinal direction of the substrate,
wherein the fixing member has a first hole, a second hole, and an interference portion arranged between the first hole and the second hole,
wherein, in a case where the substrate is fixed to the fixing member by a screw inserted through the first positioning hole of the substrate and the first hole of the fixing member and another screw inserted through the second positioning hole of the substrate and the second hole of the fixing member, the interference portion does not interfere with the connector on the substrate, and wherein, in a case where the substrate is fixed to the fixing member by a screw inserted through the first positioning hole of the substrate and the second hole of the fixing member and another screw inserted through the second positioning hole of the substrate and the first hole of the fixing member, the interference portion is contacted by the connector on the substrate.

* * * * *